United States Patent
Shi et al.

(10) Patent No.: US 11,251,798 B2
(45) Date of Patent: Feb. 15, 2022

(54) REFERENCE CLOCK SIGNAL INJECTED PHASE LOCKED LOOP CIRCUIT AND OFFSET CALIBRATION METHOD THEREOF

(71) Applicant: Montage LZ Technologies (Shanghai) Co., Ltd., Shanghai (CN)

(72) Inventors: Mingfu Shi, Shanghai (CN); Shen Feng, Shanghai (CN); Shunfang Wu, Shanghai (CN); Jun Xu, Shanghai (CN); Xinwu Cai, Shanghai (CN)

(73) Assignee: Montage LZ Technologies (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 17/126,061

(22) Filed: Dec. 18, 2020

(65) Prior Publication Data
US 2021/0194489 A1 Jun. 24, 2021

(30) Foreign Application Priority Data
Dec. 18, 2019 (CN) .......................... 201911310040.5

(51) Int. Cl.
*H03L 7/099* (2006.01)
*H03K 5/01* (2006.01)
*H03L 7/093* (2006.01)
*H03M 1/82* (2006.01)

(52) U.S. Cl.
CPC .............. *H03L 7/099* (2013.01); *H03K 5/01* (2013.01); *H03L 7/093* (2013.01); *H03M 1/82* (2013.01)

(58) Field of Classification Search
CPC ........................................................ H03L 7/099
USPC ........................................................ 331/1 R
See application file for complete search history.

(56) References Cited

U.S. PATENT DOCUMENTS

| | | | | |
|---|---|---|---|---|
| 6,809,599 B2* | 10/2004 | Shimoda | ................. | H03L 7/189 331/17 |
| 7,486,146 B2* | 2/2009 | Lin | .......................... | H03L 7/099 331/14 |
| 8,207,794 B2* | 6/2012 | Lee | .......................... | H03L 7/099 331/44 |

* cited by examiner

*Primary Examiner* — Joseph Chang

(57) ABSTRACT

The present disclosure provides a reference clock signal injected phase locked loop circuit and an offset calibration method. The reference clock signal injected phase locked loop circuit includes a first pulse generator, a second pulse generator, a state machine, a pulse selection and amplification circuit, a voltage controlled delay line, a phase detector, and a filter, and forms an offset calibration loop, a phase locked loop, a voltage controlled oscillator loop, and an injection locked loop. The state machine disconnects the phase locked loop and the voltage controlled oscillator loop and enables the offset calibration loop to calibrate the phase detector; the state machine enables the phase locked loop and the voltage controlled oscillator loop and locks a signal of the second pulse generator; and the state machine enables the injection locked loop for injecting a first pulse signal of the first pulse generator.

22 Claims, 8 Drawing Sheets

REFERENCE CLOCK SIGNAL INJECTED PHASE LOCKED LOOP CIRCUIT AND OFFSET CALIBRATION METHOD THEREOF

CROSS REFERENCE TO RELATED APPLICATION

The present application claims the benefit of priority to Chinese Patent Application No. CN 2019113100405, entitled "Reference Clock Signal Injected Phase Locked Loop Circuit and Offset Calibration Method Thereof", filed with CNIPA on Dec. 18, 2019, the disclosure of which is incorporated herein by reference in its entirety.

FIELD OF TECHNOLOGY

The present disclosure generally relates to electronic circuits, and in particular, to a phase locked loop circuit and an offset calibration method thereof.

BACKGROUND

As shown in FIG. 1, in the prior art, a reference clock signal injected phase locked loop circuit includes a pulse generator, a phase detector, a filter, a voltage controlled oscillator (VCO), and a frequency locked loop (FLL). A reference clock signal is directly injected into the reference injected phase locked loop without disconnecting the voltage controlled oscillator, and there is a phase difference $t_{os}$ between a reference pulse PUL_REFP and an output signal of the voltage controlled oscillator before the reference pulse is injected, resulting in an extremely large clock spur for VCO output after the reference pulse PUL_REFP is injected.

FIG. 2 is a timing diagram of a clock spur caused by the phase difference between a reference pulse and an output signal of a voltage controlled oscillator when a reference clock signal is injected in the prior art. For a locked reference clock signal injected phase locked loop:

$$\begin{cases} (N-1)T_{vco1} + T_{vco2} = T_{ref} \\ NT_{vco0} = T_{ref} \\ T_{vco2} - T_{vco1} = t_{os} \end{cases},$$

N is the ratio of an average frequency of the VCO signal of a voltage controlled oscillator to a clock frequency of a reference clock signal, $T_{ref}$ is a clock period of the reference clock signal, $T_{vco0}$ is an average cycle of the VCO signal of the voltage controlled oscillator, and $T_{vco1}$ and $T_{vco2}$ are two transient periods of the VCO signal of the voltage controlled oscillator.

$$\begin{cases} T_{vco1} = T_{vco0} - \dfrac{t_{os}}{N} \\ T_{vco2} = T_{vco0} + \dfrac{N-1}{N} t_{os} \end{cases}$$

may be derived.

Therefore, a periodic sequence of the VCO signal of the voltage controlled oscillator may be obtained, as given by:

$$\{T_{vco1}, T_{vco1}, T_{vco1}, \ldots, T_{vco1}, T_{vco2}\} = T_{vco0} + \left\{ -\dfrac{1}{N}, -\dfrac{1}{N}, -\dfrac{1}{N}, \ldots, -\dfrac{1}{N}, \dfrac{N-1}{N} \right\} \cdot t_{os}$$

For the periodic sequence of the VCO signal of the voltage controlled oscillator generated due to the phase difference tos, according to Fourier transform analysis, when the phase difference tos is 1 ps and the average frequency of the voltage controlled oscillator VCO signal is 2.5 GHz, a clock spur of a corresponding reference clock on the spectrum of the voltage controlled oscillator VCO signal is ~52 dBc. When the phase difference tos is 10 µs and the average frequency of the voltage controlled oscillator VCO signal is 2.5 GHz, a clock spur of a corresponding reference clock on the spectrum of the voltage controlled oscillator VCO signal is ~31.8 dBc. It may be learned that a larger phase difference tos (that is, a phase offset) indicates a higher clock spur of the reference clock. This greatly limits the application of the reference clock injected phase locked loop.

Therefore, a reference clock signal injected phase locked loop circuit and an offset calibration method thereof need to be provided.

SUMMARY

One advantage of one or more aspects of the present disclosure is that it improves conventional reference clock signal injected phase locked loop circuits and solves the phase mismatch problems of the reference clock signal injected loop.

In one aspect of the present application, a reference clock signal injected phase locked loop circuit is provided. The reference clock signal injected phase locked loop circuit comprises a plurality of loops including an offset calibration loop (OCL), a phase locked loop (PLL), a voltage controlled oscillator (VCO) loop, and an injection locked loop. The plurality of loops are formed based on a first pulse generator, a second pulse generator, a state machine, a pulse width selection and amplification circuit, a voltage controlled delay line, a phase detector, and a filter. The offset calibration loop comprises the first pulse generator, the state machine, the phase detector, and the pulse width selection and amplification circuit, the first pulse generator configured to generate a first pulse signal based on a reference clock signal.

The voltage controlled oscillator loop comprises the second pulse generator, the pulse width selection and amplification circuit, and the voltage controlled delay line, the second pulse generator configured to generate a second pulse signal. The phase locked loop comprises the first pulse generator, the second pulse generator, the phase detector, the filter, the voltage controlled delay line, and the pulse width selection and amplification circuit. The injection locked loop comprises the pulse width selection and amplification circuit, the first pulse generator, the second pulse generator, the state machine, the phase detector, the filter, and the voltage controlled delay line.

The state machine is configured to disconnect the phase locked loop and the voltage controlled oscillator loop and enable the offset calibration loop to calibrate the phase detector by using the first pulse signal. The state machine is configured to enable, after calibrating the phase detector, the phase locked loop and the voltage controlled oscillator loop and lock, by using the calibrated phase detector, a phase of the second pulse signal to the phase locked loop and the voltage controlled oscillator loop. And the state machine is further configured to switch, after locking the phase of the second pulse signal, the phase locked loop to the injection locked loop and enable the injection locked loop for injecting the first pulse signal.

In another aspect of the present application, an offset calibration method for a reference clock signal injected phase locked loop is provided. The method is applicable to a reference clock signal injected phase locked loop circuit, the reference clock signal injected phase locked loop circuit comprises components including a first pulse generator, a second pulse generator, a state machine, a pulse width selection and amplification circuit, a voltage controlled delay line, a phase detector, and a filter, and the components are used to form an offset calibration loop, a phase locked loop, a voltage controlled oscillator loop, and an injection locked loop.

The offset calibration loop comprises the first pulse generator, the state machine, and the phase detector. The first pulse generator configured to generate a first pulse signal based on a reference clock signal; the voltage controlled oscillator loop comprises the second pulse generator, the pulse width selection and amplification circuit, and the voltage controlled delay line, the second pulse generator configured to generate a second pulse signal. The phase locked loop comprises the first pulse generator, the second pulse generator, the phase detector, the filter, the voltage controlled delay line, and the pulse width selection and amplification circuit. The injection locked loop comprises the pulse width selection and amplification circuit, the first pulse generator, the second pulse generator, the state machine, the phase detector, the filter, the voltage controlled delay line.

The offset calibration method comprises: disconnecting, by the state machine, the phase locked loop and the voltage controlled oscillator loop, and enabling the offset calibration loop to calibrate the phase detector by using the first pulse signal; enabling, by the state machine, the phase locked loop and the voltage controlled oscillator loop, and locking, by using the calibrated phase detector, a phase of the second pulse signal to the phase locked loop and the voltage controlled oscillator loop; and switching, by the state machine, the phase locked loop to the injection locked loop, and enabling the injection locked loop for injecting the first pulse signal.

Some advantages of one or more aspects of the present disclosure are as following:

(1) In a reference clock signal injected phase locked loop circuit of present disclosure, a reference clock signal injected path and a phase detection path of a phase locked loop are combined into one path, and an offset of a phase detector is zeroed out in advance, so that a phase mismatch problem of the reference clock signal injected loop is solved.

(2) A clock spur output by a phase locked loop is eliminated.

(3) The reference clock signal injected phase locked loop circuit and the offset calibration method may be applied to an electronic circuit or system such as a general clock generator, a frequency multiplier, a phase locked loop, or clock data recovery (CDR).

DETAILED DESCRIPTION

Figure 1:
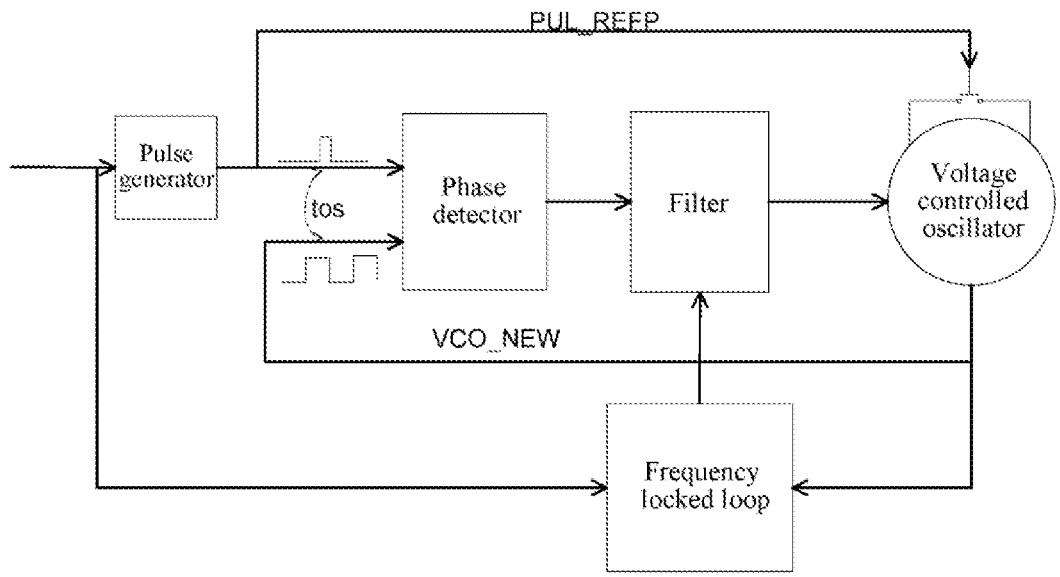
FIG. 1 is a schematic structural diagram of a framework of a reference clock signal injected phase locked loop circuit in the prior art.
Figure 2:
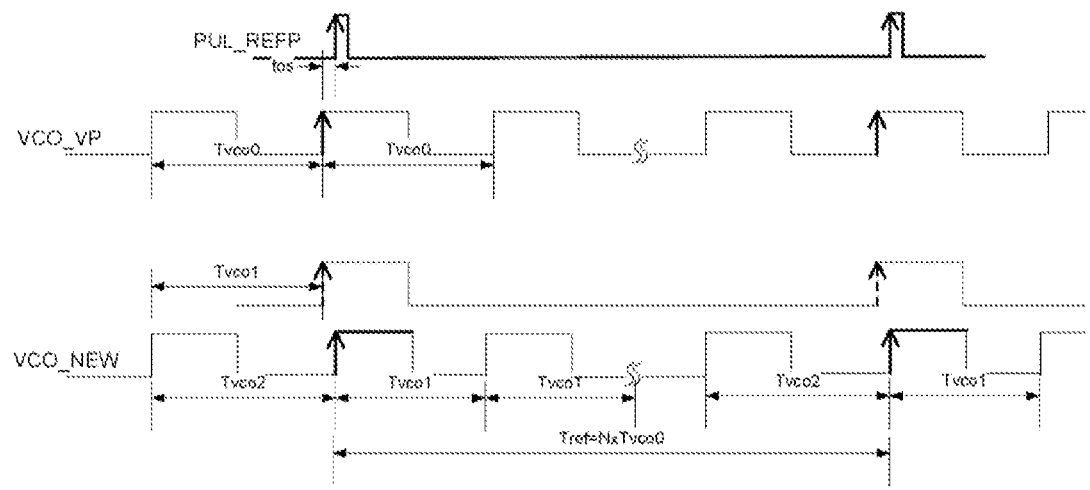
FIG. 2 is a timing diagram of a clock spur caused by a phase error when a reference clock signal is injected in the prior art.

The following describes implementations of the present disclosure by using specific embodiments. A person skilled in the art may easily understand other advantages and effects of the present disclosure from the content disclosed herein.

It should be noted that the structures, proportions, sizes, and the like shown in the drawings of this specification, in coordination with the content disclosed in this specification, are only used to help a person skilled in the art to read and understand the present disclosure, and they are not intended to limit the conditions under which the present disclosure can be implemented. Any modifications to the structure, changes to the proportional relationship or the adjustment on the size should fall within the scope of the technical content disclosed by the present disclosure without affecting the effects and the objectives that can be achieved by the present disclosure. In addition, the terms such as "upper", "lower", "left", "right", "middle", and "a" mentioned in this specification are also merely for facilitating clear descriptions, but are not intended to limit the scope of implementation of the present disclosure. Without substantially changing the technical content, changes or adjustments of relative relationships thereof should also fall within the scope of implementation of the present disclosure.

In a reference clock signal injected phase locked loop circuit and an offset calibration method for a reference clock signal injected phase locked loop of the present disclosure, a loop path through which a reference clock signal is injected coincides with a loop path through which a phase error is detected; that is, the phase error caused by injection of the reference clock signal is equivalent to an offset of a phase detector, and the offset of the phase detector is zeroed out in advance, so that the phase error caused by the injection of the reference clock signal (that is, a phase detection error after an offset calibration loop is locked) is 0, thereby eliminating a clock spur output by a phase locked loop and solving a phase mismatch problem caused by the injection of the reference clock signal.

Figure 3:
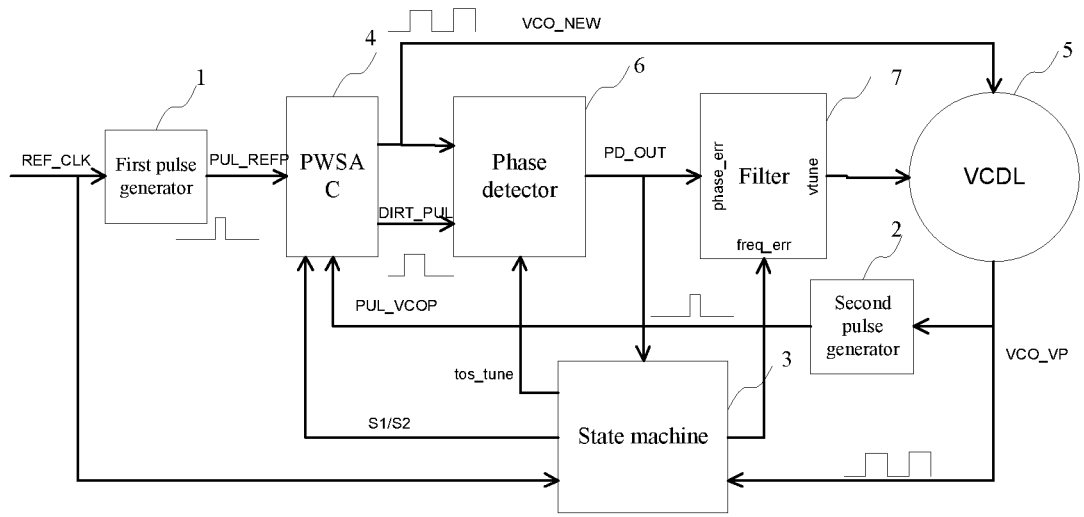
FIG. 3 is a schematic structural diagram of a framework of a reference clock signal injected phase locked loop circuit according to an embodiment of the present disclosure.
Figure 4:
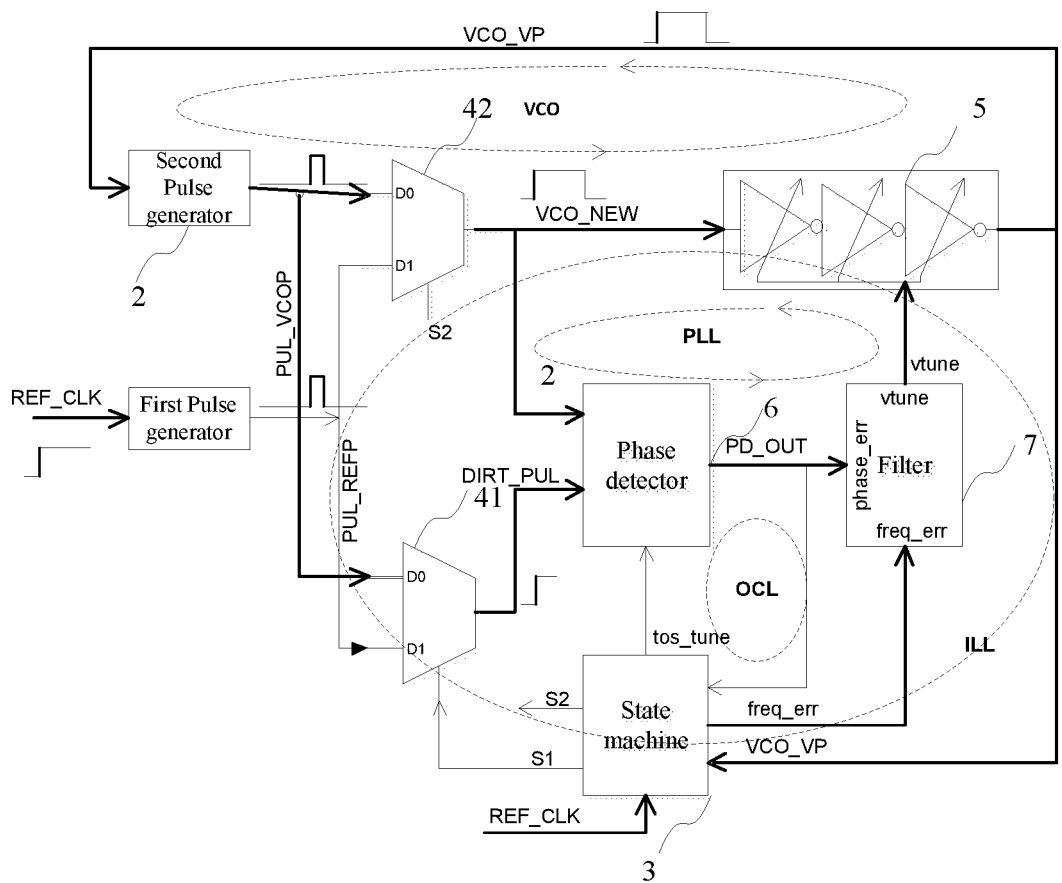
FIG. 4 is a schematic diagram of a circuit structure of a reference clock signal injected phase locked loop circuit according to an embodiment of the present disclosure.

As shown in FIG. 3 and FIG. 4, in an embodiment, the reference clock signal injected phase locked loop circuit of the present disclosure comprises a first pulse generator 1, a second pulse generator 2, a state machine 3, a pulse width selection and amplification circuit (PWSAC) 4, a voltage controlled delay line (VCDL) 5, a phase detector 6, and a filter 7. The pulse width selection and amplification circuit 4 is connected to an input end to which output ends of the first pulse generator 1 and the second pulse generator 2 are connected, output ends of the state machine 3 are connected respectively to the pulse width selection and amplification circuit 4, the phase detector 6, and the filter 7, output ends of the pulse width selection and amplification circuit 4 are respectively connected to the voltage controlled delay line 5 and the phase detector 6, the phase detector 6 is connected to the state machine 3 and the filter 7, the filter 7 is connected to the voltage controlled delay line 5, and the voltage controlled delay line 5 is connected to the second pulse generator 2 and state machine 3.

In some embodiments, the first pulse generator 1 and the second pulse generator 2 are narrow pulse generators, the first pulse generator 1 is configured to receive a reference clock signal REF_CLK and generate a first narrow pulse signal PUL_REFP, and the second pulse generator 2 is configured to receive a voltage controlled signal VCO_VP output by the voltage controlled delay line and generate a second narrow pulse signal PUL_VCOP. The pulse width selection and amplification circuit 4 is configured to select, under control of the state machine 3, narrow pulse signal and convert the narrow pulse signal into wide pulse signals respectively by amplifying apulse width of the narrow pulse signal. The pulse width selection and amplification circuit 4 comprises a first pulse width selection and amplification circuit 41 and a second pulse width selection and amplification circuit 42, and the first pulse width selection and amplification circuit 41 and the second pulse width selection and amplification circuit 42 are respectively configured to select one of the first narrow pulse signal PUL_REFP and the second narrow pulse signal PUL_VCOP that are output by the first pulse generator 1 and the second pulse generator 2 as an input and respectively convert the selected narrow pulse signal(s) into a first wide pulse signal DIRT_PUL and a second wide pulse signal VCO_NEW for output.

In some embodiments, the phase detector 6 performs phase detection on the first wide pulse signal DIRT_PUL and the second wide pulse signal VCO_NEW that are respectively output by the first pulse width selection and amplification circuit 41 and the second pulse width selection and amplification circuit 42 and outputs a phase detection result signal PD_OUT. The voltage controlled delay line 5 is connected to an output end of the second pulse width selection and amplification circuit 42 and is configured to receive the second wide pulse signal VCO_NEW, and a delay time of the voltage controlled delay line 5 is controlled by the filter 7 (that is, the frequency of VCO_VP is controlled). The state machine 3 is connected to a control end of the pulse width selection and amplification circuit 4, to control signal selection of the pulse width selection and amplification circuit 4. For example, when S1 and S2 that are output by the state machine 3 are at a high level, a port D1 of the pulse width selection and amplification circuit 4 is gated; and when S1 and S2 are at a low electrical level, a port D0 of the pulse width selection and amplification circuit 4 is gated.

The reference clock signal injected phase locked loop circuit of the present disclosure comprises the following four loops:

(1) An offset calibration loop (OCL)

The offset calibration loop comprises the first pulse generator 1, the state machine 3, the phase detector 6, and the pulse width selection and amplification circuit 4.

(2) A voltage controlled oscillator (VCO) loop

The voltage controlled oscillator loop comprises the second pulse generator 2, the pulse width selection and amplification circuit 4, and the voltage controlled delay line 5.

(3) A phase locked loop (PLL)

The phase locked loop comprises the first pulse generator 1, the second pulse generator 2, the phase detector 6, the filter 7, the voltage controlled delay line 5, and the pulse width selection and amplification circuit 4.

(4) An injection locked loop (ILL)

The injection locked loop comprises the first pulse generator 1, the second pulse generator 2, the state machine 3, the pulse width selection and amplification circuit 4, the voltage controlled delay line 5, the phase detector 6, and the filter 7.

Figure 5:
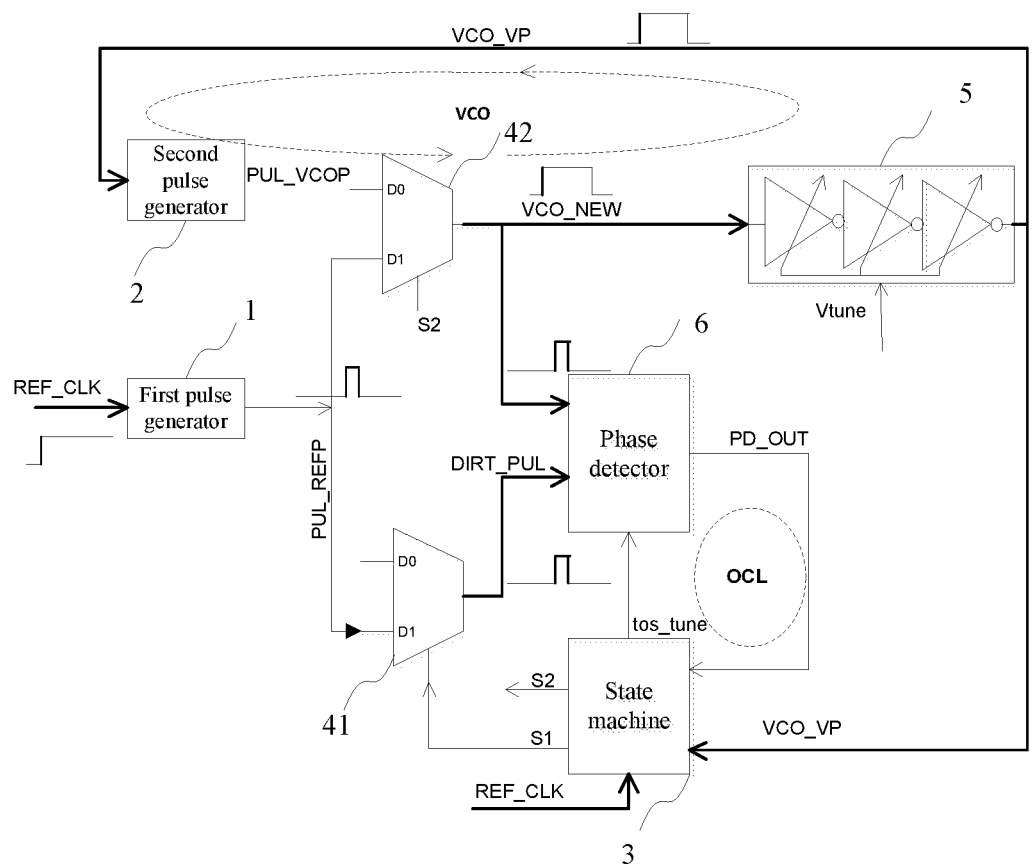
FIG. 5 is an equivalent circuit diagram of the reference clock signal injected phase locked loop circuit of FIG. 4 working in an offset calibration loop mode.

To eliminate the clock spur caused by injection of the reference clock signal, the phase difference between the injected reference clock signal and a corresponding VCO signal of voltage controlled oscillator needs to be eliminated. The working principle of the reference clock signal injected phase locked loop circuit of the present disclosure is as follows:

First, as shown in FIG. 5, the state machine 3 switches the phase locked loop to the injection locked loop and the voltage controlled oscillator loop, and enables the offset calibration loop to calibrate the phase detector 6 by using a first pulse signal generated by the first pulse generator 1. Specifically, the state machine 3 switches the phase locked loop to the injection locked loop and the voltage controlled oscillator loop, and sets values of selection signals S1 and S2 to respectively control the first pulse width selection and amplification circuit 41 and the second pulse width selection and amplification circuit 42 to select the first narrow pulse signal PUL_REFP as an input, amplify a pulse width of the first narrow pulse signal PUL_REFP, and output the amplified signals to a first input end and a second input end of the phase detector 6.

In some embodiments, the state machine 3 adjusts the phase detector 6 according to a phase detection result signal of the phase detector 6, to calibrate an offset of the phase detector 6. Specifically, the state machine 3 adjusts a control bit of the phase detector 6 by increasing or reducing a value input into an offset-symbol control end tos_tune of the phase detector 6 until an average value of the phase detection result signal PD_OUT output by the phase detector 6 is 0, so that the phase offset of the phase detector 6 is calibrated and a zero phase offset of the phase detector 6 is achieved. The offset-symbol control end tos_tune has a dual function: the first function is that the state machine calibrates an offset inside the phase detector by using the offset-symbol control end tos_tune; and a second function is that the state machine changes the polarity of a phase detection result signal PD_OUT according to a procedure by using the offset-symbol control end tos_tune.

Figure 6:
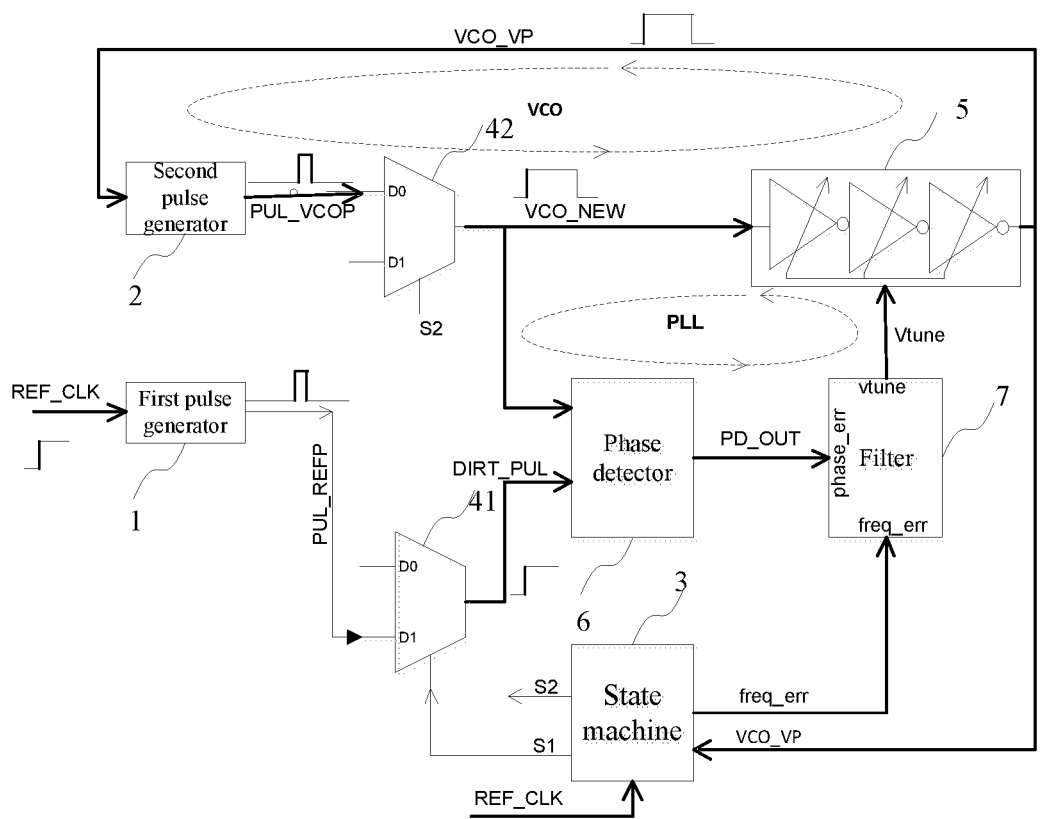
FIG. 6 is an equivalent circuit diagram of the reference clock signal injected phase locked loop circuit of FIG. 4 working in a phase locked loop (comprising frequency locking and phase locking) mode.

As shown in FIG. 6, the state machine 3 enables the phase locked loop and the voltage controlled oscillator loop, and locks, by using the calibrated phase detector, the phase of a second pulse signal PUL_VCOP generated by the second pulse generator. Specifically, the state machine 3 sets the values of the selection signals S1 and S2 to control the first pulse width selection and amplification circuit 41 and the second pulse width selection and amplification circuit 42 to respectively select a first narrow pulse signal PUL_REFP and a second narrow pulse signal PUL_VCOP as inputs, convert the first narrow pulse signal PUL_REFP and the second narrow pulse signal PULVCOP into a corresponding first wide pulse signal DIRT_PUL and a corresponding second wide pulse signal VCO_NEW, and respectively output them to the first input end and the second input end of the phase detector 6.

In some embodiments, the phase detector 6 outputs the phase detection result signal PD_OUT into a phase error control end phase_err of the filter 7 as a phase error phase_err of the filter 7. Meanwhile, the digital state machine 3 has a frequency lock function where a frequency error of the voltage controlled signal VCO_VP output by the voltage controlled delay line is calculated by using the reference clock signal REF_CLK, and the frequency error freq_err is output to a frequency error control end freq_err of the filter 7. The filter 7 adjusts, according to an average value of the phase detection result signal PD_OUT and an average value of the frequency error freq_err, by using a voltage Vtune applied by the filter, a phase and a frequency of the output signal VCOVP output by the voltage controlled delay line 5 until the average value of the detection result signal PD_OUT is 0 and the average value of the frequency error freq_err is also 0, at this time, the frequency and the phase of the voltage controlled signal VCO_VP output by the voltage controlled delay line are locked; that is, the phase locked loop and the voltage controlled oscillator loop are locked.

Figure 7:
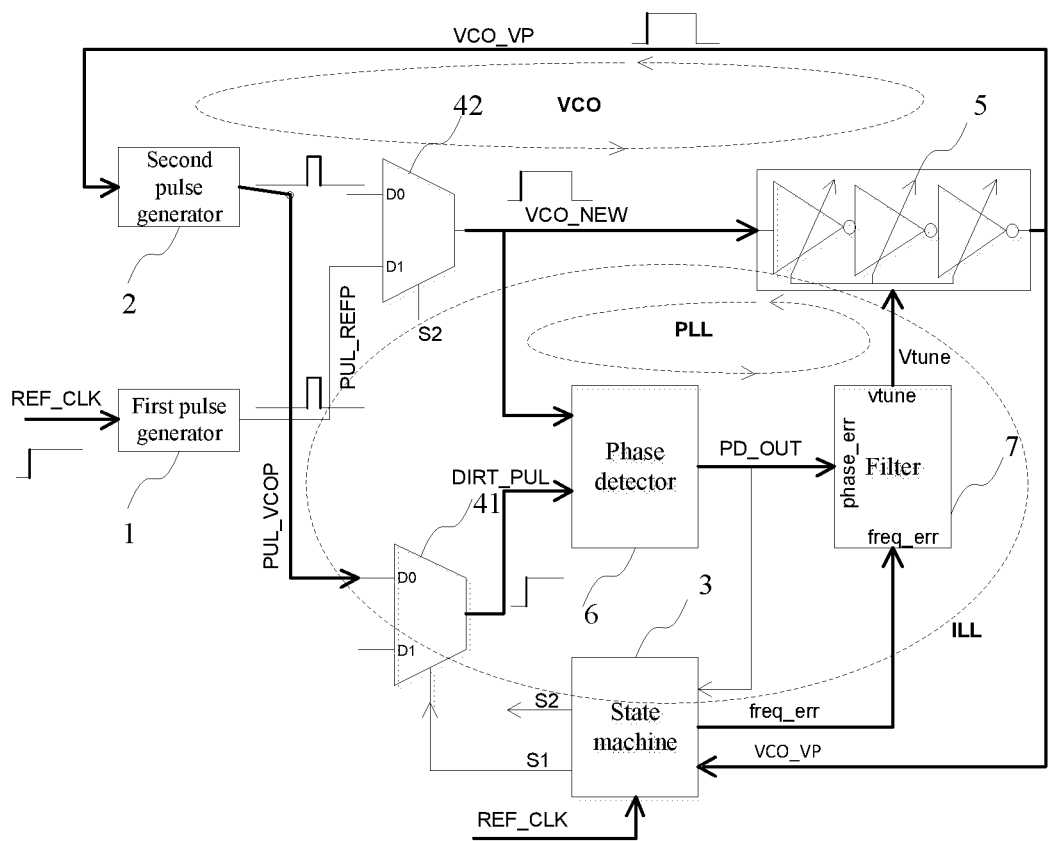
FIG. 7 is an equivalent circuit diagram of the reference clock signal injected phase locked loop circuit of FIG. 4 in an injection state.

Finally, as shown in FIG. 7, the state machine 3 switches the phase locked loop to the injection locked loop, to complete periodic injection of the first pulse signal PUL_REFP generated by the first pulse generator 1. Specifically, when the state machine 3 detects that a phase of the phase locked loop is locked (that is, both the average value of the phase detection result signal PD_OUT and the average value of the frequency error freq_err are equal to 0), the state machine 3 switches the phase locked loop to the injection locked loop. The state machine 3 sets the values of the selection signals S1 and S2, to control the first pulse width selection and amplification circuit 41 and the second pulse width selection and amplification circuit 42 to respectively select a second narrow pulse signal PUL_VCOP and a first narrow pulse signal PUL_REFP as inputs, and convert the second narrow pulse signal PUL_VCOP and the first narrow pulse signal PUL_REFP into a corresponding first wide pulse signal DIRT_PUL and a corresponding second wide pulse signal VCO_NEW, and output them to the first input end and the second input end of the phase detector 6, so that phase periodic injection of a reference clock signal of the injection locked loop is implemented.

The above has the same effect of exchanging the first narrow pulse signal PUL_REFP and the second narrow pulse signal PUL_VCOP in the frequency locking and phase locking operation so that a rising edge of a current second wide pulse signal VCO_NEW output by the second pulse width selection and amplification circuit 42 is transferred to the first wide pulse signal DIRT_PUL in the frequency locking and phase locking operation, and a rising edge of a current first wide pulse signal DIRT_PUL output by the first pulse width selection and amplification circuit 41 is transferred to the second wide pulse signal VCO_NEW in the frequency locking and phase locking operation. In addition, when the phase locked loop and the voltage controlled oscillator loop are locked in the frequency locking and phase locking operation, rising edges of the first wide pulse signal DIRT_PUL and the second wide pulse signal VCO_NEW are aligned. Therefore, when the reference clock signal is injected, rising edges of the current second wide pulse signal VCO_NEW and the current first wide pulse signal DIRT_PUL that correspond to the reference clock signal REF_CLK and the voltage controlled signal VCO_VP output by the voltage controlled delay line are also aligned, thereby effectively eliminating the clock spur.

It should be noted that, that the first narrow pulse signal PUL_REFP and the second narrow pulse signal PUL_VCOP are exchanged in the frequency locking and phase locking operation also means that signals that are input into the first end and the second end of the phase detector 6 are exchanged (correspondingly, phases are exchanged). Therefore, when switching to the injection locked loop, the state machine should adjust a value of the offset-symbol control end tos_tune input to the phase detector 6, so that the phase of the phase detection result signal PD_OUT output by the phase detector is inverted, to maintain a stable negative feedback of the phase locked loop.

Figure 8:
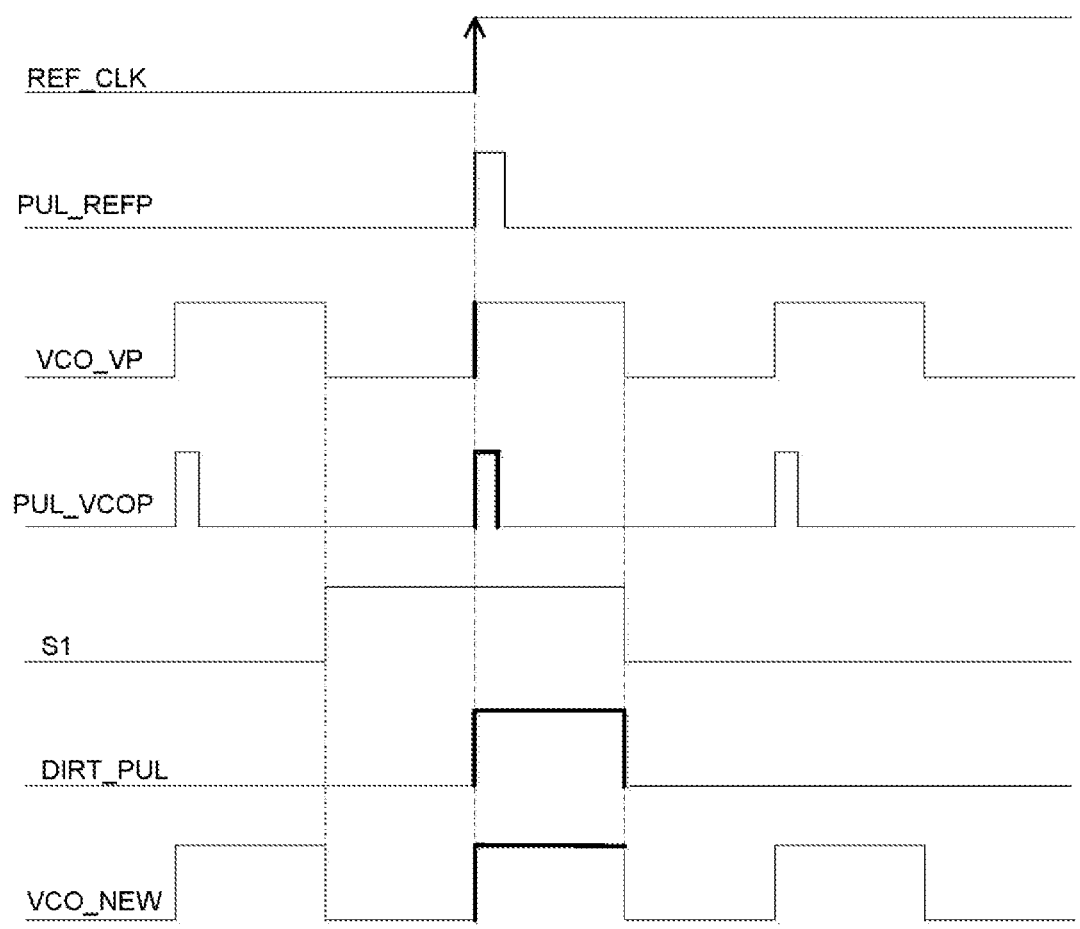
FIG. 8 is a signal timing diagram of a reference clock signal injected phase locked loop circuit when a reference clock signal is injected according to an embodiment of the present disclosure.

Specifically, FIG. 8 is a signal timing diagram of injection of a reference clock signal. Before the reference clock signal REF_CLK is injected, a frequency and a phase of the phase locked loop are locked. In a period in which a first selection signal 51 is at a high level, the first pulse signal PUL_REFP and the second pulse signal PUL_VCOP are exchanged. After exchanging, the rising edge of the VCO_NEW signal is transferred to the DIRTPUL signal, the rising edge of the reference clock signal REF_CLK is transferred to that of the current second wide pulse signal VCO_NEW The DIRT_PUL signal and the VCO_NEW signal are injected into the phase detector 6. Because the rising edges of the DIRTPUL signal and the VCO_NEW signal are aligned when the loop is locked, there is no impact of a phase difference tos, thereby eliminating the clock spur output by the phase locked loop.

It should be noted that because there may be a relatively large warm-up drift, or impact of some external factors on the phase locked loop (for example, voltage fluctuation), the phase error is offset from a working range in which the reference clock signal is injected into the phase locked loop, and the state machine needs to switch back and forth between the frequency locking and phase locking operation and the injection operation of the reference clock signal according to an actual situation. During each switch, the polarity of a phase detection result signal PD_OUT is changed accordingly, to maintain the negative feedback feature of the phase locked loop.

Figure 9:
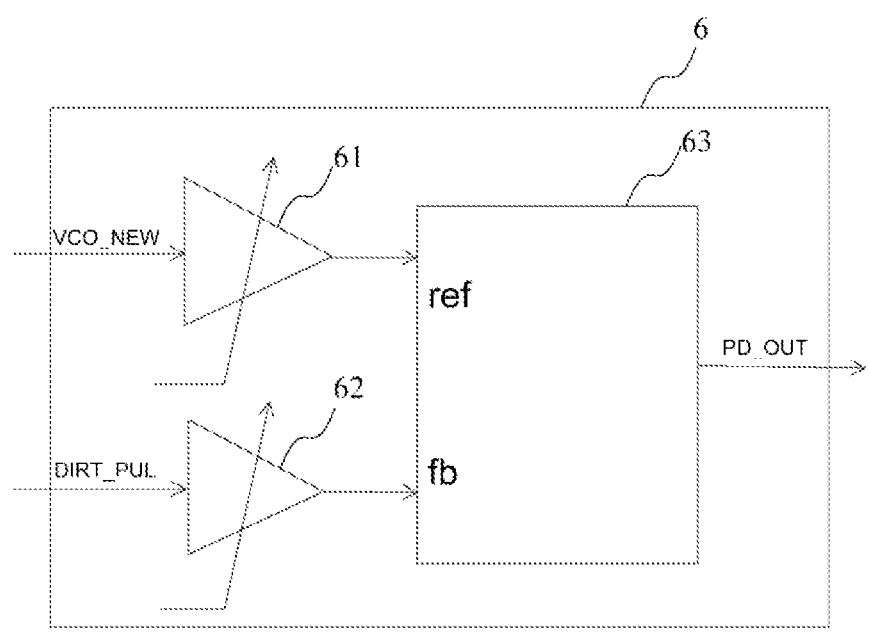
FIG. 9 is a schematic structural diagram of a phase detector according to an embodiment of the present disclosure.

As shown in FIG. 9, in an embodiment of the present disclosure, the phase detector 6 comprises a first digital-to-time converter 61, a second digital-to-time converter 62, and a phase detector/digital-to-time converter 63, and both the first digital-to-time converter 61 and the second digital-to-time converter 62 are connected to the phase detector/digital-to-time converter 63. Input ends of the first digital-to-time converter 61 and the second digital-to-time converter 62 are respectively used as two input ends of the phase detector 6, and the phase detector/digital-to-time converter 63 is used as an output end of the phase detector 6. The state machine 3 is connected to control ends of the first digital-to-time converter 61 and the second digital-to-time converter 62, and phase mismatch of the phase detector is calibrated by adjusting the first digital-to-time converter 61 and/or the second digital-to-time converter 62.

Figure 10:
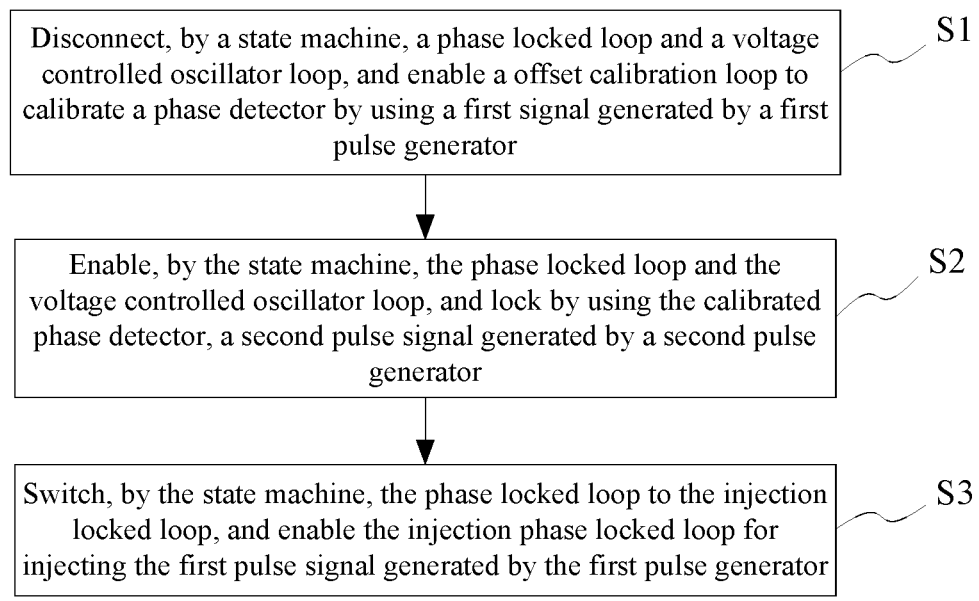
FIG. 10 is a flowchart of an offset calibration method for a reference clock signal injected phase locked loop according to an embodiment of the present disclosure.

As shown in FIG. 10, the offset calibration method for a reference clock signal injected phase locked loop of the present disclosure is applicable to a reference clock signal injected phase locked loop circuit. The reference clock signal injected phase locked loop circuit comprises a first pulse generator, a second pulse generator, a state machine, a pulse width selection and amplification circuit, a voltage controlled delay line, a phase detector, and a filter. The pulse width selection and amplification circuit is connected to an input end to which output ends of the first pulse generator and the second pulse generator are connected. The state machine is connected to the pulse width selection and amplification circuit, the phase detector, and the filter. Output ends of the pulse width selection and amplification circuit are respectively connected to the voltage controlled delay line and the phase detector, the phase detector is connected to the filter, the filter is connected to the state machine and the voltage controlled delay line, and the voltage controlled delay line is connected to the second pulse generator.

The reference clock signal injected phase locked loop circuit of the present disclosure comprises the following four loops:
an offset calibration loop (OCL);
a voltage controlled oscillator (VCO) loop;
a phase locked loop (PLL); and
an injection locked loop (ILL).

The offset calibration loop comprises the first pulse generator, the state machine, the phase detector, and the pulse width selection and amplification circuit. The voltage controlled oscillator (VCO) loop comprises the second pulse generator, the pulse width selection and amplification circuit, and the voltage controlled delay line. The phase locked loop comprises the first pulse generator, the second pulse generator, the phase detector, the filter, the voltage controlled delay line, and the pulse width selection and amplification circuit. The injection locked loop comprises the first pulse generator, the second pulse generator, the state machine, the pulse width selection and amplification circuit, the voltage controlled delay line, the phase detector, and the filter.

The offset calibration method for a reference clock signal injected phase locked loop comprises the following operations:

S1: disconnecting, by the state machine, the phase locked loop and the voltage controlled oscillator loop, and enabling the offset calibration loop to calibrate the zero offset phase detector by using a first pulse signal generated by the first pulse generator.

Specifically, the phase locked loop is switched to the injection locked loop and the voltage controlled oscillator loop, and the reference clock signal REF_CLK is input into the first pulse generator, to generate a first narrow pulse signal PUL_REFP. The first narrow pulse signal PUL_REFP is input into the voltage controlled delay line through the pulse width selection and amplification circuit. In the pulse width selection and amplification circuit, the first narrow pulse signal PUL_REFP is divided into two paths of signals and input into the zero offset phase detector. The state machine adjusts the zero offset phase detector according to a phase detection result signal PD_OUT by using an offset-symbol control end tos_tune until an average value of the phase detection result signal PD_OUT is 0, thereby eliminating an offset.

S2: enabling, by the state machine, the phase locked loop and the voltage controlled oscillator loop, and locking, by using the calibrated phase detector, a second pulse signal generated by the second pulse generator.

Specifically, the phase locked loop and the voltage controlled oscillator loop are enabled, the reference clock signal REF_CLK is input into the first pulse generator, to generate a first narrow pulse signal PUL_REFP, and an output signal VCO_VP output by the voltage controlled delay line is input into the second pulse generator, to generate a second narrow pulse signal PUL_VCOP. The second narrow pulse signal PUL_VCOP is processed by the second pulse width selection and amplification circuit to generate a second wide pulse signal DIRT_PUL, which is input into the voltage controlled delay line and one end of the phase detector, and the first narrow pulse signal PUL_REFP is processed by the first pulse width selection and amplification circuit to generate a first wide pulse signal VCO_NEW, which is input into the other end of the phase detector. The filter adjusts, according to a phase detection result signal PD_OUT output by the phase detector, an average value of a voltage controlled delay line output signal VCO_VP output by the voltage controlled delay line, and in turn adjusts the phase detection result signal PD_OUT output by the phase detector until an average value of the phase detection result signal PD_OUT is 0, so that frequency locking is implemented. In this case, frequencies of the reference clock signal REF_CLK and output signal VCO_VP output by the voltage controlled delay line are the same.

S3. switching, by the state machine, the phase locked loop to the injection locked loop, and enabling the injection locked loop for injecting the first pulse signal generated by the first pulse generator.

Specifically, the phase locked loop is switched to the injection locked loop, that is, the injection locked loop is enabled, the reference clock signal REF_CLK is input into the first pulse generator, to generate a first narrow pulse signal PUL_REFP, and the output signal VCO_VP output by the voltage controlled delay line is input into the second pulse generator, to generate a second narrow pulse signal PUL_VCOP. The first narrow pulse signal PUL_REFP is processed by the second pulse width selection and amplification circuit to generate a first wide pulse signal VCO_NEW, which is input into the voltage controlled delay line and one end of the phase detector, and the second pulse signal PUL_VCOP is processed by the first pulse width selection and amplification circuit to generate a second wide pulse signal DIRT_PUL, which is input into the other end of the phase detector, thereby implementing injection of a reference clock signal of the injection locked loop.

It should be noted that operations S2 and S3 may be switched back and forth. A condition for switching from S2 to S3 may be that: the phase locked loop locks the second narrow pulse signal, and when the phase error after the phase locked loop is locked is less than a preset specific value, the phase locked loop is switched to the injection locked loop. A condition for switching from S3 to S2 may be that: when the phase error after the phase locked loop is locked is greater than the preset specific value, the injection locked loop is switched back to the phase locked loop, and the second narrow pulse signal is re-locked.

In conclusion, according to the reference clock signal injected phase locked loop circuit and the offset calibration method thereof of the present disclosure, a reference clock signal injected path and a phase detection path of a phase locked loop are combined into one path, and an offset of a phase detector is zeroed out in advance, so that a phase mismatch problem of the reference clock signal injected loop is solved, and the clock spur output by the phase locked loop is eliminated. The reference clock signal injected phase locked loop circuit and the offset calibration method may be applied to an electronic circuit or system such as a general clock generator, a frequency multiplier, a phase locked loop, or CDR. Therefore, the present disclosure effectively overcomes various defects in the prior art, and has great value in industrial use.

While particular elements, embodiments, and applications of the present invention have been shown and described, it is understood that the invention is not limited thereto because modifications may be made by those skilled in the art, particularly in light of the foregoing teaching. It is therefore contemplated by the appended claims to cover such modifications and incorporate those features which come within the spirit and scope of the invention.

We claim:

1. A reference clock signal injected phase locked loop circuit, comprising
a plurality of loops including an offset calibration loop (OCL), a phase locked loop (PLL), a voltage controlled oscillator (VCO) loop, and an injection locked loop,
the plurality of loops are formed based on a first pulse generator, a second pulse generator, a state machine, a pulse width selection and amplification circuit, a voltage controlled delay line, a phase detector, and a filter,
the offset calibration loop comprises the first pulse generator, the state machine, the phase detector, and the pulse width selection and amplification circuit, the first pulse generator configured to generate a first pulse signal based on a reference clock signal,
the voltage controlled oscillator loop comprises the second pulse generator, the pulse width selection and amplification circuit, and the voltage controlled delay line, the second pulse generator configured to generate a second pulse signal,
the phase locked loop comprises the first pulse generator, the second pulse generator, the phase detector, the filter, the voltage controlled delay line, and the pulse width selection and amplification circuit,
the injection locked loop comprises the pulse width selection and amplification circuit, the first pulse generator, the second pulse generator, the state machine, the phase detector, the filter, and the voltage controlled delay line,
the state machine is configured to disconnect the phase locked loop and the voltage controlled oscillator loop and enable the offset calibration loop to calibrate the phase detector by using the first pulse signal,
the state machine is configured to enable, after calibrating the phase detector, the phase locked loop and the voltage controlled oscillator loop and lock, by using the calibrated phase detector, a phase of the second pulse signal to the phase locked loop and the voltage controlled oscillator loop, and
the state machine is configured to switch, after locking the phase of the second pulse signal, the phase locked loop to the injection locked loop and enable the injection locked loop for injecting the first pulse signal.

2. The reference clock signal injected phase locked loop circuit as in claim 1, wherein
the pulse width selection and amplification circuit is connected with the first pulse generator and the second pulse generator for receiving the first pulse signal and the second pulse signal, and is configured to select, under control of the state machine, one or both of the first pulse signal and the second pulse signal for pulse width amplification processing to convert the selected one or both of the first pulse signal and the second pulse signal into corresponding one or two wide pulse signals, and
the second pulse generator is connected with the voltage controlled delay line, and is configured to receive a voltage controlled signal output by the voltage controlled delay line.

3. The reference clock signal injected phase locked loop circuit as in claim 2, wherein
when the offset calibration loop calibrates the phase detector by using the first pulse signal, the pulse width selection and amplification circuit is configured to select the first pulse signal for two paths of pulse width amplification processing and output the two paths of processed first pulse signals into the phase detector, and
the state machine is configured to adjust, by using an offset-symbol control end, the phase detector according to a phase detection result signal of the phase detector, until an average value of the phase detection result signal is 0.

4. The reference clock signal injected phase locked loop circuit as in claim 2, wherein
when the phase of the second pulse signal is locked by using the calibrated phase detector, the pulse width selection and amplification circuit is configured to select both of the first pulse signal and the second pulse signal for pulse width amplification processing, output the processed second pulse signal into the voltage controlled delay line and the phase detector, and output the processed first pulse signal into the phase detector,
the filter is configured to adjust, according to an phase detection result signal output by the phase detector, a voltage controlled signal frequency output by the voltage controlled delay line and in turn adjust the phase detection result signal, until an average value of the phase detection result signal is 0, and
the state machine is configured to perform frequency locking when an average value of the phase detection result signal of the phase detector is 0.

5. The reference clock signal injected phase locked loop circuit as in claim 2, wherein
when the signal of the first pulse generator is injected and the state machine detects a reference clock signal, the pulse width selection and amplification circuit is configured to:
select both of the first pulse signal and the second pulse signal for pulse width amplification processing,
output the processed first pulse signal into the voltage controlled delay line and the phase detector, and
output the processed second pulse signal into the phase detector.

6. The reference clock signal injected phase locked loop circuit as in claim 1, wherein
the pulse width selection and amplification circuit comprises a first pulse width selection and amplification circuit and a second pulse width selection and amplification circuit, wherein
both of the first pulse signal and the second pulse signal are input into the first pulse width selection and amplification circuit and the second pulse width selection and amplification circuit,
the first pulse width selection and amplification circuit is configured to select one of the first pulse signal and the second pulse signal for pulse width amplification processing and output the processed selected signal into the voltage controlled delay line and the phase detector, the second pulse width selection and amplification circuit is configured to select one of the first pulse signal and the second pulse signal for pulse width amplification processing and output the processed selected signal into the phase detector, and the state machine is configured to implement selection of the first pulse signal and the second pulse signal by sending a selection signal to the first pulse width selection and amplification circuit and the second pulse width selection and amplification circuit.

7. The reference clock signal injected phase locked loop circuit as in claim 6, wherein the voltage controlled oscillator loop comprises the second pulse generator, the second pulse width selection and amplification circuit, and the voltage controlled delay line that are annularly connected.

8. The reference clock signal injected phase locked loop circuit as in claim 1, wherein the second pulse generator is configured to convert a voltage controlled signal output by the voltage controlled delay line into a narrow pulse signal, and the first pulse generator is configured to convert the reference clock signal into a narrow pulse signal.

9. The reference clock signal injected phase locked loop circuit as in claim 1, wherein the phase detector comprises a first digital-to-time converter, a second digital-to-time converter, and a phase detector/digital-to-time converter, and both the first digital-to-time converter and the second digital-to-time converter are connected to the phase detector/digital-to-time converter.

10. The reference clock signal injected phase locked loop circuit as in claim 1, wherein the state machine is further configured to calculate, by using a reference clock signal, a frequency error of a voltage controlled signal output by the voltage controlled delay line, and output the frequency error to the filter.

11. The reference clock signal injected phase locked loop circuit as in claim 1, wherein when switching to the injection locked loop, the state machine is further configured to adjust an offset-symbol control end of the phase detector to invert the phase of a phase detection result signal output by the phase detector.

12. The reference clock signal injected phase locked loop circuit as in claim 10, wherein the filter is configured to adjust, by using a voltage applied by the filter, a phase and a frequency of a voltage controlled signal output by the voltage controlled delay line according to an average value of a phase detection result signal of the phase detector and an average value of a frequency error, until the average value of the phase detection result signal is 0, the average value of the frequency error is 0, and the frequency and the phase of the voltage controlled signal are locked.

13. An offset calibration method for a reference clock signal injected phase locked loop circuit, wherein the reference clock signal injected phase locked loop circuit comprises components including a first pulse generator, a second pulse generator, a state machine, a pulse width selection and amplification circuit, a voltage controlled delay line, a phase detector, and a filter, and the components are used to form an offset calibration loop, a phase locked loop, a voltage controlled oscillator loop, and an injection locked loop, the offset calibration loop comprises the first pulse generator, the state machine, and the phase detector, the first pulse generator configured to generate a first pulse signal based on a reference clock signal, the voltage controlled oscillator loop comprises the second pulse generator, the pulse width selection and amplification circuit, and the voltage controlled delay line, the second pulse generator configured to generate a second pulse signal, the phase locked loop comprises the first pulse generator, the second pulse generator, the phase detector, the filter, the voltage controlled delay line, and the pulse width selection and amplification circuit, the injection locked loop comprises the pulse width selection and amplification circuit, the first pulse generator, the second pulse generator, the state machine, the phase detector, the filter, and the voltage controlled delay line, and the offset calibration method comprises:

disconnecting, by the state machine, the phase locked loop and the voltage controlled oscillator loop, and enabling the offset calibration loop to calibrate the phase detector by using the first pulse signal;

enabling, by the state machine, the phase locked loop and the voltage controlled oscillator loop, and locking, by using the calibrated phase detector, a phase of the second pulse signal to the phase locked loop and the voltage controlled oscillator loop; and switching, by the state machine, the phase locked loop to the injection locked loop, and enabling the injection locked loop for injecting the first pulse signal.

14. The offset calibration method as in claim 13, wherein the pulse width selection and amplification circuit is configured to receive the first pulse signal and the second pulse signal from the first pulse generator and the second pulse generator, and select, under control of the state machine, one or both of the first pulse signal and the second pulse signal for pulse width amplification processing to convert the selected one or both of the first pulse signal and the second pulse signal into corresponding one or two wide pulse signals.

15. The offset calibration method as in claim 14, wherein the calibrating the phase detector by using the first pulse signal comprises:

selecting, by the pulse width selection and amplification circuit, the first pulse signal for two paths of pulse width amplification processing and outputting the two paths of processed first pulse signals into the phase detector; and adjusting, by the state machine using an offset-symbol control end, the phase detector according to a phase detection result signal of the phase detector, until an average value of the phase detection result signal is 0.

16. The offset calibration method as in claim 14, wherein the locking, by using the calibrated phase detector, the phase of the second pulse signal comprises:

selecting, by the pulse width selection and amplification circuit, both of the first pulse signal and the second pulse signal for pulse width amplification processing, outputting the processed second pulse signal into the voltage controlled delay line and the phase detector, and outputting the processed first pulse signal into the phase detector, calculating, by the state machine using the reference clock signal, a frequency error of a voltage controlled signal output by the voltage controlled delay line, and outputting the frequency error to the filter; and adjusting, by the filter, a voltage controlled signal frequency output by the voltage controlled delay line according to an average value of an phase detection result signal output by the phase detector and an average value of the frequency error, until an average value of the phase detection result signal of the phase detector is 0 and the average value of the frequency error is 0.

17. The offset calibration method as in claim 14, wherein the injecting the first pulse signal comprise:

in response to the state machine detecting a reference clock signal, selecting, by the pulse width selection and amplification circuit, both of the first pulse signal and the second pulse signal for pulse width amplification processing, outputting the processed first pulse signal into the voltage controlled delay line and the phase detector, and outputting the processed first pulse signal into the phase detector.

18. The offset calibration method as in claim 17, wherein the injecting the first pulse signal further comprises:

in response to the switching to the injection locked loop, adjusting, by the state machine, an offset-symbol control end of the phase detector to invert the phase of a phase detection result signal output by the phase detector.

19. The offset calibration method as in claim 14, wherein the pulse width selection and amplification circuit comprises a first pulse width selection and amplification circuit and a second pulse width selection and amplification circuit, wherein both of the first pulse signal and the second pulse signal are input into the first pulse width selection and amplification circuit and the second pulse width selection and amplification circuit, the first pulse width selection and amplification circuit is configured to select one of the first pulse signal and the second pulse signal for pulse width amplification processing and output the processed selected signal into the voltage controlled delay line and the phase detector, the second pulse width selection and amplification circuit is configured to select one of the first pulse signal and the second pulse signal for pulse width amplification processing and output the processed selected signal into the phase detector, and the state machine is configured to implement selection of the first pulse signal and the second pulse signal by sending a selection signal to the first pulse width selection and amplification circuit and the second pulse width selection and amplification circuit.

20. The offset calibration method as in claim 13, wherein the voltage controlled oscillator loop comprises the second pulse generator, the second pulse width selection and amplification circuit, and the voltage controlled delay line, and the second pulse generator, the second pulse width selection and amplification circuit, and the voltage controlled delay line are annularly connected.

21. The offset calibration method as in claim 13, wherein the second pulse generator is configured to convert a voltage controlled signal output by the voltage controlled delay line into a narrow pulse signal, and the first pulse generator is configured to convert the reference clock signal into a narrow pulse signal.

22. The offset calibration method as in claim 13, wherein the phase detector comprises a first digital-to-time converter, a second digital-to-time converter, and a phase detector/digital-to-time converter, and both the first digital-to-time converter and the second digital-to-time converter are connected to the phase detector/digital-to-time converter.

\* \* \* \* \*